United States Patent
Im et al.

(10) Patent No.: US 11,812,649 B2
(45) Date of Patent: Nov. 7, 2023

(54) DISPLAY DEVICE THAT PREVENTS DETERIORATION DUE TO EXTERNAL LIGHT

(71) Applicant: Samsung Display Co., LTD., Yongin-si (KR)

(72) Inventors: Choong Youl Im, Yongin-si (KR); Ha Seok Jeon, Seoul (KR); Beohm Rock Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 286 days.

(21) Appl. No.: 17/212,493

(22) Filed: Mar. 25, 2021

(65) Prior Publication Data

US 2021/0359012 A1 Nov. 18, 2021

(30) Foreign Application Priority Data

May 15, 2020 (KR) .................. 10-2020-0058377

(51) Int. Cl.
| | | |
|---|---|---|
| H10K 59/38 | (2023.01) | |
| H10K 50/86 | (2023.01) | |
| H10K 59/122 | (2023.01) | |
| H10K 59/35 | (2023.01) | |

(52) U.S. Cl.
CPC .......... *H10K 59/38* (2023.02); *H10K 50/865* (2023.02); *H10K 59/122* (2023.02); *H10K 59/352* (2023.02); *H10K 59/353* (2023.02)

(58) Field of Classification Search
CPC .... H10K 59/38; H10K 59/352; H10K 59/353; H10K 59/35; H10K 50/865; H10K 59/122

See application file for complete search history.

(56) References Cited

U.S. PATENT DOCUMENTS

| | | | |
|---|---|---|---|
| 2016/0365397 A1 | 12/2016 | Seo et al. | |
| 2018/0197922 A1* | 7/2018 | Song | H10K 50/805 |
| 2019/0006429 A1* | 1/2019 | Ota | H10K 59/126 |
| 2019/0131355 A1* | 5/2019 | Chae | H10K 59/352 |
| 2019/0245017 A1 | 8/2019 | Jeon et al. | |
| 2020/0041837 A1* | 2/2020 | Jiang | G02F 1/133609 |
| 2021/0175476 A1* | 6/2021 | Oh | H10K 50/86 |

FOREIGN PATENT DOCUMENTS

| | | |
|---|---|---|
| KR | 10-1830613 | 2/2018 |
| KR | 10-2019-0062678 | 6/2019 |
| KR | 10-2019-0070192 | 6/2019 |
| KR | 10-2003269 | 7/2019 |

* cited by examiner

*Primary Examiner* — Nduka E Ojeh

(74) *Attorney, Agent, or Firm* — KILE PARK REED & HOUTTEMAN PLLC

(57) ABSTRACT

A display device according to an embodiment includes a display unit including first emissive regions displaying a first color, second emissive regions displaying a second color, and third emissive regions displaying a third color; and an anti-reflection unit overlapping the display unit and including first color filters overlapping the first emissive regions, second color filters overlapping the second emissive regions, and third color filters overlapping the third emissive regions, wherein in a plan view, a ratio of an area of the first emissive regions, an area of the second emissive regions, and an area of the third emissive regions and a ratio of an area of the first color filters, an area of the second color filters, and an area of the third color filters are different.

20 Claims, 13 Drawing Sheets

DISPLAY DEVICE THAT PREVENTS DETERIORATION DUE TO EXTERNAL LIGHT

CROSS-REFERENCE TO RELATED APPLICATION(S)

This application claims priority to and the benefit of Korean Patent Application No. 10-2020-0058377 under § 119, filed in the Korean Intellectual Property Office (KIPO) on May 15, 2020, the entire contents of which are incorporated herein by reference.

BACKGROUND

1. Technical Field

The disclosure relates to a display device, and more particularly, to a display device capable of preventing color deterioration and contrast ratio deterioration due to reflection of external light.

2. Description of the Related Art

A liquid crystal display (LCD), a plasma display panel (PDP), an organic light emitting diode (OLED) display, a field effect display (FED), an electrophoretic display device, and like are known.

Among them, the organic light emitting display has a self-luminance characteristic, and unlike the liquid crystal display, a separate light source is not required, so thickness and weight may be reduced. In addition, the organic light emitting display has high quality characteristics such as low power consumption, high luminance, and fast response speed.

On the other hand, as external light incident to the organic light emitting diode display is reflected from the device surface, the contrast may be greatly reduced. Therefore, it may be necessary to improve visibility by providing an anti-reflection unit on the organic light emitting diode display to prevent deterioration of contrast caused by the external light. In order to prevent transmittance deterioration due to the anti-reflection unit, a light blocking layer is formed on a non-emissive region and a color filter that transmits light of a wavelength similar to that emitted from the organic emission layer may be formed on an emissive region overlapping the organic light emitting part. As described above, when the color filter is formed on the anti-reflection unit, the transmittance deterioration may be prevented, but color perception and contrast may be deteriorated by recognizing light of a specific wavelength.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a display device capable of preventing contrast deterioration and transmittance deterioration and preventing deterioration of color perception due to a specific color of light being recognized through an anti-reflection unit.

It is apparent that the disclosure is not limited to the above-described purpose and may be variously extended in a range that does not deviate from the idea and scope of the disclosure.

A display device according to an embodiment includes a display unit including a plurality of first emissive regions displaying a first color, a plurality of second emissive regions displaying a second color, and a plurality of third emissive regions displaying a third color; and an anti-reflection unit overlapping the display unit and including a plurality of first color filters overlapping the plurality of first emissive regions, a plurality of second color filters overlapping the plurality of second emissive regions, and a plurality of third color filters overlapping the plurality of third emissive regions, wherein in a plan view, a ratio of sum of areas of the plurality of first emissive regions, a sum of areas of the plurality of second emissive regions, and a sum of areas of the plurality of third emissive regions and a ratio of the plurality of first color filters, the plurality of second color filters, and the plurality of third color filters are different.

The sum of areas of the plurality of first emissive regions may be smaller than the area sum of areas of the plurality of second emissive regions, and the area-sum of areas of the plurality of first color filters may be larger than the area sum of areas of the plurality of second color filters.

The sum of areas of the plurality of third emissive regions may be smaller than the sum of areas of the plurality of second emissive regions, and the sum of areas of the plurality of third color filters may be larger than the sum of areas of the plurality of second color filters.

The anti-reflection unit may include a blocking layer including a plurality of openings overlapping the plurality of first color filters, the plurality of second color filters, and the plurality of third color filters, a first overlapping part is disposed on the blocking layer, the plurality of first color filters and the plurality of second color filters overlapping each other in the first overlapping part, a second overlapping part is disposed on the blocking layer, the plurality of second color filters and the plurality of third color filters overlapping each other in the second overlapping part, the plurality of first color filters may be disposed on the plurality of the second color filters at the first overlapping part, the plurality of third color filters may be disposed on the plurality of second color filters at the second overlapping part.

A first emissive region of the plurality of first emissive regions, two second emissive regions of the plurality of second emissive regions, and a third emissive region of the plurality of third emissive regions may form a dot.

The two second emissive regions may be spaced apart from each other and disposed in a first row, the first emissive region and the third emissive region may be spaced apart from each other at a second distance and disposed in a second row adjacent to the first row, and the two second emissive regions disposed in the first row and the one first emissive region and the one third emissive region disposed in the second row may be alternately disposed in zigzags.

The first color may be red, the second color may be green, and the third color may be blue.

The first emissive region and the one third emissive region may be disposed adjacent to each other, the two second emissive regions may be disposed under the first emissive region and the one third emissive region, and the first color may be red, the second color may be blue, and the third color may be green.

A first emissive region of the plurality of first emissive regions, a second emissive region of the plurality of second emissive regions, and a third emissive region of the plurality of third emissive regions may form a dot.

A display device according to an embodiment includes a plurality of pixels including a plurality of first pixels displaying a first color, a plurality of second pixels displaying a second color, and a plurality of third pixels displaying a third color, wherein a first pixel of the plurality of first pixels, two second pixels of the plurality of second pixels, and one third pixel of the plurality of third pixels form a dot, the plurality of first pixels each include a first emissive region emitting a first color, and a first color filter overlapping the first emissive region and transmitting light of the first color, the plurality of second pixels each include a second emissive region emitting a second color, and a second color filter overlapping the second emissive region and transmitting light of the second color, and the plurality of third pixels each include a third emissive region emitting a third color, and a third color filter overlapping the third emissive region and transmitting light of the third color, in a plan view, an area of the first emissive region of the first pixel is less than a sum of areas of two second emissive regions of the two second pixels, in the plan view, an area of the third emissive region of the third pixel is less than the sum of the areas of the two second emissive regions of the two second pixels, and in the plan view, the area of the first color filter of the first pixel is larger than a sum of areas of two second color filters of the two second pixels.

A ratio of the area of the first emissive region of the first pixel, the sum of the areas of the two second emissive regions of the two second pixels, and the area of the third emissive region of the third pixel may be about 1:1.2:1.1 or about 1:1.3:0.9.

The ratio of the sum of the areas of the two second color filter of the two second pixels to the area of the first color filter of the first pixel may be about 0.5 to about 0.8.

The ratio of an area of the third color filter of the third pixel to the area of the first color filter of the one first pixel may be about 0.5 to about 1.

The two second emissive regions may be spaced apart from each other and disposed in the first row, the first emissive region and the third emissive region may be spaced apart from each other and disposed in a second row adjacent to the first row, and the two second emissive regions disposed in the first row, and the first emissive region and the third emissive region disposed in the second row are alternately disposed in zigzags.

The first color may be red, the second color may be green, and the third color may be blue.

A display device according to an embodiment may include a pixel electrode including a plurality of first pixel electrodes, a plurality of second pixel electrodes, and a plurality of third pixel electrodes disposed on a substrate; a pixel definition layer disposed on the substrate and including a plurality of first pixel openings overlapping the plurality of first pixel electrodes, a plurality of second pixel openings overlapping the plurality of second pixel electrodes, and a plurality of third pixel openings overlapping the plurality of third pixel electrodes; an emissive region including a plurality of first emissive regions disposed in the plurality of first pixel openings and displaying a first color, a plurality of second emissive regions disposed in the plurality of second pixel openings and displaying a second color, and a plurality of third emissive regions disposed in the plurality of third pixel openings and displaying a third color; a common electrode disposed on the emissive region; an encapsulation layer disposed on the common electrode and overlapping the emissive region; a blocking layer disposed on the encapsulation layer and including a plurality of first openings overlapping the plurality of first pixel openings, a plurality of second openings overlapping the plurality of second pixel openings, and a plurality of third openings overlapping the plurality of third pixel openings; and a color filter including a plurality of first color filters disposed in the plurality of first openings and transmitting light of the first color, a plurality of second color filters disposed in the plurality of second openings and transmitting light of the second color, and a plurality of third color filters disposed in the plurality of third openings and transmitting light of the third color, and in a plan view, a ratio of a sum of areas of the plurality of first emissive regions, a sum of areas of the plurality of second emissive regions, and a sum of areas of the plurality of third emissive regions and a ratio of a sum of areas of the plurality of first color filters, the a sum of areas of plurality of second color filters, and a sum of areas of the plurality of third color filters are different.

The sum of areas of the plurality of first emissive regions may be smaller than the sum of areas of the plurality of second emissive regions, and the sum of areas of the plurality of first color filters may be larger than the sum of areas of the plurality of second color filters.

A first emissive region of the plurality of first emissive regions, two second emissive regions of the plurality of second emissive regions, and a third emissive region of the plurality of third emissive regions may form a dot. The two second emissive regions may be spaced apart from each other and disposed in a first row, the first emissive region and the third emissive region may be spaced apart from each other and disposed in a second row adjacent to the first row. The two second emissive regions disposed in the first row, and the one first emissive region and the third emissive region disposed in the second row may be alternately disposed in zigzags.

A first emissive region of the plurality of first emissive regions and a third emissive region of the plurality of third emissive region may be disposed adjacent to each other. Two second emissive regions of the plurality of second emissive regions may be disposed under the first emissive region and the third emissive region. The plurality of first emissive regions may display red, the plurality of second emissive regions may display blue, and the plurality of third emissive regions may display green.

A first emissive region of the plurality of first emissive regions, a second emissive region of the plurality of second emissive regions, and a third emissive region of the plurality of third emissive regions may form a dot.

According to the display device according to an embodiment, it is possible to prevent transmittance deterioration while preventing contrast deterioration by including the anti-reflection unit including the color filter, and the light of a specific color may be prevented from being recognized by adjusting the area of the color filter of the anti-reflection unit.

It is obvious that the effect of the disclosure is not limited to the above-described effect, and can be variously extended in a range that does not deviate from the idea and scope of the disclosure.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
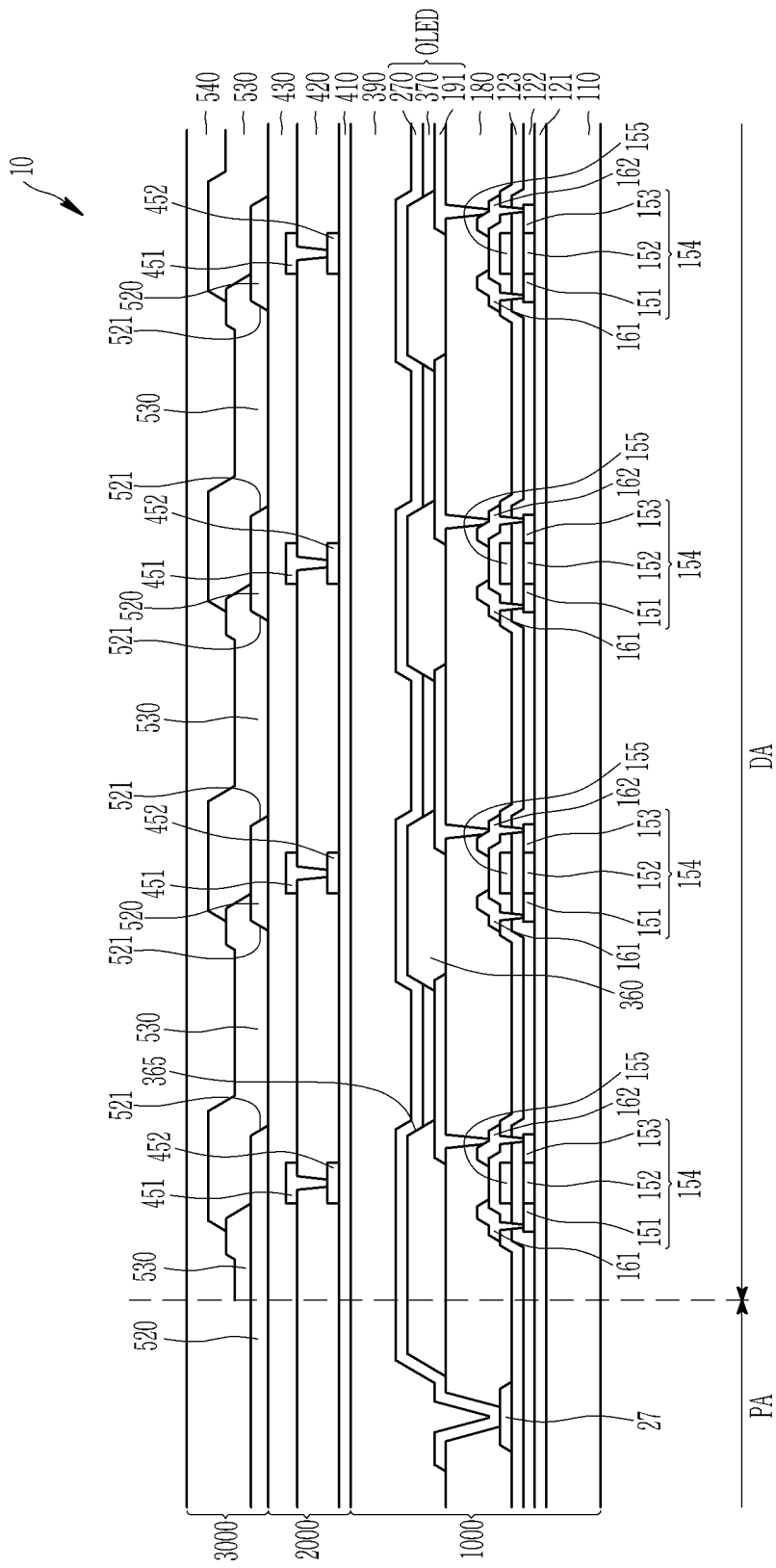
FIG. 1 is a schematic cross-sectional view of a display device according to an embodiment.

The disclosure will be described more fully hereinafter with reference to the accompanying drawings, in which embodiments of the disclosure are shown. As those skilled in the art would realize, the described embodiments may be modified in various ways, all without departing from the spirit or scope of the disclosure.

Like reference numerals generally designate like elements throughout the specification.

In addition, the size and thickness of each configuration shown in the drawings may be arbitrarily shown for better understanding and ease of description, but the disclosure is not limited thereto. In the drawings, the thickness of layers, films, panels, regions, etc., may be exaggerated for clarity. In the drawings, for better understanding and ease of description, the thicknesses of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" (or "under" or "below") means positioned on or below the object portion, and does not necessarily mean positioned on the upper side of the object portion based on a gravitational direction.

Unless explicitly described to the contrary, the word "comprise," and its variations such as "comprises" or "comprising," will be understood to imply the inclusion of stated elements but not the exclusion of any other elements.

Throughout the specification, the phrase "on a plane" or "in a plan view" means viewing the object portion from the top, and the phrase "on a cross-section" means viewing a cross-section of which the object portion is vertically cut from the side.

In the specification, to the phrase "connected to," may mean that two or more elements are directly connected to or two or more elements are electrically connected through any other element(s) as well as being indirectly connected to and being physically connected to, or it may mean that they are referred to by different names according to a position or function but are integral with each other.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

A display device according to an embodiment is described with reference to FIG. 1. FIG. 1 is a schematic cross-sectional view of a display device according to an embodiment.

Referring to FIG. 1, the display device 10 according to an embodiment may include a display unit 1000, a touch unit 2000, and an anti-reflection unit 3000. The touch unit 2000 may be disposed between the display unit 1000 and the anti-reflection unit 3000. The display device 10 may include a display area DA and a non-display area PA.

The display unit 1000 may include a substrate 110, and a buffer layer 121 may be disposed on the substrate 110. The substrate 110 may include a flexible material such as plastic that may be flexible, bendable, foldable, or rollable.

The buffer layer 121 may include a silicon nitride ($SiN_x$) or a silicon oxide ($SiO_x$). The buffer layer 121 may be disposed between the substrate 110 and a semiconductor layer 154 to block impurities from the substrate 110 during a crystallization process for forming polysilicon, thereby increasing characteristics of the polysilicon, and to flatten the substrate 110, relieving stress on the semiconductor layer 154 formed on the buffer layer 121.

The semiconductor layer 154 may be disposed on the buffer layer 121. The semiconductor layer 154 may be made of (or include) polysilicon or an oxide semiconductor. The semiconductor layer 154 may include a channel region 152, a source region 151, and a drain region 153. The source region 151 and the drain region 153 may be disposed on opposite sides of the channel region 152. The channel region 152 may be an intrinsic semiconductor doped with an impurity, and the source region 151 and drain region 153 may be extrinsic semiconductors doped with a conductive impurity. The semiconductor layer 154 may be made of an oxide semiconductor, and a separate protective layer (not shown) may be added to protect the oxide semiconductor material that is vulnerable to external environments such as a high temperature.

A gate insulating layer 122 may be disposed on the semiconductor layer 154 to cover or overlap the semiconductor layer 154. The gate insulating layer 122 may be a single layer or a multilayer including at least one of a silicon nitride ($SiN_x$) and a silicon oxide ($SiO_x$).

A gate electrode 155 may be disposed on the gate insulating layer 122, and the gate electrode 155 may be a multilayer in which a metal film including any one of copper (Cu), a copper alloy, aluminum (Al), an aluminum alloy, molybdenum (Mo), and a molybdenum alloy is deposited.

An interlayer insulating layer 123 may be disposed on the gate electrode 155 and the gate insulating layer 122. The interlayer insulating layer 123 may include a silicon nitride ($SiN_x$) or a silicon oxide ($SiO_x$). The interlayer insulating layer 123 may include an opening that exposes the source region 151 and the drain region 153, respectively.

A source electrode 161 and a drain electrode 162 may be formed on the interlayer insulating layer 123. The source electrode 161 and the drain electrode 162 may be electrically connected to the source region 151 and the drain region 153 of the semiconductor layer 154 through the opening formed in the interlayer insulating layer 123 and the gate insulating layer 122, respectively.

A passivation layer 180 may be disposed on the interlayer insulating layer 123, the source electrode 161, and the drain electrode 162. The passivation layer 180 may be planarized by covering (or overlapping) the interlayer insulating layer 123, the source electrode 161, and the drain electrode 162, and thus, a pixel electrode 191 may be formed on the passivation layer 180 without a step. The passivation layer 180 may be made of (or include) an organic material such as a polyacryl-based resin or a polyimide-based resin, or a laminated film of an organic material and an inorganic material.

The pixel electrode 191 may be disposed on the passivation layer 180. The pixel electrode 191 may be electrically connected to the drain electrode 162 through the opening of the passivation layer 180.

A driving transistor including the gate electrode 155, the semiconductor layer 154, the source electrode 161, and the drain electrode 162 may be electrically connected to the pixel electrode 191 to supply a driving current to an organic light emitting element (OLED). The display device according to the embodiment may further include, in addition to the driving transistor shown in FIG. 1, a switching transistor (not shown) that is electrically connected to the data line and transmits a data voltage in response to a scan signal, and a compensation transistor (not shown) that is electrically connected to the driving transistor and compensates for a threshold voltage of the driving transistor in response to the scan signal.

A pixel definition layer 360 may be disposed on the passivation layer 180 and the pixel electrode 191, and the pixel definition layer 360 may have a pixel opening 365 overlapping the pixel electrode 191 and defining a light emission region. The pixel definition layer 360 may include an organic material such as a polyacryl-based resin and a polyimide-based resin, or a silica-based inorganic material. The pixel opening 365 may have a planar shape substantially similar to that of the pixel electrode 191. The pixel opening 365 may have a rhombic or octagonal shape similar thereto on a plane, but is not limited thereto, and may have any shape such as a quadrangle or polygon shape.

An organic emission layer 370 may be disposed on the pixel electrode 191 overlapping the pixel opening 365. The organic emission layer 370 may be made of a low molecular organic material or a high molecular organic material such as poly(3,4-ethylenedioxythiophene) (PEDOT). The organic emission layer 370 may be a multilayer including one or more of a hole injection layer (HIL), a hole transporting layer (HTL), an electron transporting layer (ETL), and an electron injection layer (EIL).

Most of the organic emission layer 370 may be disposed within the pixel opening 365 and may also be disposed on the side of or above the pixel definition layer 360.

A common electrode 270 may be disposed on the organic emission layer 370. The common electrode 270 may be disposed over or on pixels, and a common voltage may be applied to the common electrode 270 through a common voltage transmission part 27 of the non-display area PA.

The pixel electrode 191, the organic emission layer 370, and the common electrode 270 may form (or constitute) the organic light emitting element (or OLED).

Here, the pixel electrode 191 may be an anode of a hole injection electrode, and the common electrode 270 may be a cathode of an electron injection electrode. However, an embodiment is not limited thereto, and the pixel electrode 191 may be the cathode and the common electrode 270 may be the anode, depending on the driving method for the organic light emitting diode display.

Holes and electrons may be injected into the organic emission layer 370 from the pixel electrode 191 and the common electrode 270, respectively, and emission may occur in case that an exciton falls from an excited state to a ground state.

An encapsulation layer 390 may be disposed on the common electrode 270. The encapsulation layer 390 may seal the display unit 1000 by covering or overlapping not only the top surface but also the side surface of the display unit 1000. The encapsulation layer 390 may be disposed on the whole surface of the display area DA and may extend from the display area DA, so that an end of the encapsulation layer 390 may be disposed in the non-display area PA.

Since the organic light emitting element is susceptible to moisture and oxygen, the encapsulation layer 390 may seal the display unit 1000 to block the inflow of moisture and oxygen from the outside. The encapsulation layer 390 may include multiple layers, may be formed of a composite film including an inorganic film and an organic film, and may be formed of a triple layer in which an inorganic film, an organic film, and an inorganic film are sequentially formed.

The touch unit 2000 may be disposed on the encapsulation layer 390.

The touch unit 2000 will now be described below. An inorganic layer 410 may be disposed on the encapsulation layer 390. The inorganic layer 410 may include at least one of a metal oxide, a metal oxynitride, a silicon oxide, a silicon nitride, and a silicon oxynitride. The inorganic layer 410 may cover or overlap the encapsulation layer 390 to protect the encapsulation layer 390 and may prevent moisture permeation. The inorganic layer 410 may serve to reduce parasitic capacitance between the common electrode 270 and a touch electrode.

A first touch cell connection part 452 may be disposed on the inorganic layer 410, and a first planarization layer 420 may be disposed on the first touch cell connection part 452.

A first touch cell 451 may be disposed on the first planarization layer 420. A second touch cell and a second touch cell connection part may be disposed on the first planarization layer 420. Although not illustrated in the embodiment, the first touch cell 451 and the second touch cell (not shown) may be adjacent to each other, and the first touch cell connection part 452 and the second touch cell connection part (not shown) may overlap each other, in a plan view.

A touch cell passivation layer 430 may be disposed on the first touch cell 451 and the second touch cell (not shown). The touch cell passivation layer 430 may protect the first touch cell 451 and the second touch cell (not shown) by covering (or overlapping) the first touch cell 451 and the second touch cell (not shown) so that the first touch cell 451 and the second touch cell are prevented from being exposed to the outside. The touch cell passivation layer 430 may include an inorganic material such as a silicon nitride ($SiN_x$) or a silicon oxide ($SiO_x$), or an organic material such as a polyacrylate resin and a polyimide resin.

The anti-reflection unit 3000 may be disposed on the touch unit 2000.

The anti-reflection unit 3000 may include a blocking layer 520 and a color filter 530.

The blocking layer 520 may overlap the pixel definition layer 360 of the display unit 1000 and have a narrower width than the pixel definition layer 360. The blocking layer 520 may be disposed over the non-display area PA.

The blocking layer 520 may have openings 521 overlapping the pixel openings 365 of the pixel definition layer 360, and each opening 521 may overlap the pixel opening 365.

The width of the opening 521 of the blocking layer 520 may be wider than that of the pixel opening 365 that overlaps the opening 521.

The color filter 530 may be disposed on the blocking layer 520. Most of each color filter 530 may be disposed in the opening 521 of the blocking layer 520. A second planarization layer 540 may be disposed on the color filters 530.

The anti-reflection unit 3000 may prevent external light incident from the outside, from being reflected by a wire or the like and visually recognized. The blocking layer 520 of the anti-reflection unit 3000 may be disposed to overlap an area between the light emission region of the non-display area PA and the display area DA to absorb the incident external light, thereby reducing the light from being incident on the light emission region. Therefore, the degree that the external light is reflected and visually recognized may be reduced.

The color filter 530 of the anti-reflection unit 3000 may reduce the visibility of the external light after the external light is incident on the pixel definition layer 360 from the outside and reflected. Since the color filter 530 does not completely block light, the reflected external light may be prevented from being visually recognized without reducing the efficiency of light emitted from the organic emission layer 370.

In general, to prevent the visibility of the reflected external light, a polarization layer may be used, but it may lower the efficiency of light emitted from the organic emission layer. However, according to an embodiment, it is possible to prevent the reflected external light from being visually recognized without reducing the efficiency of light emitted from the organic emission layer 370 through the anti-reflection unit 3000.

Figure 2:
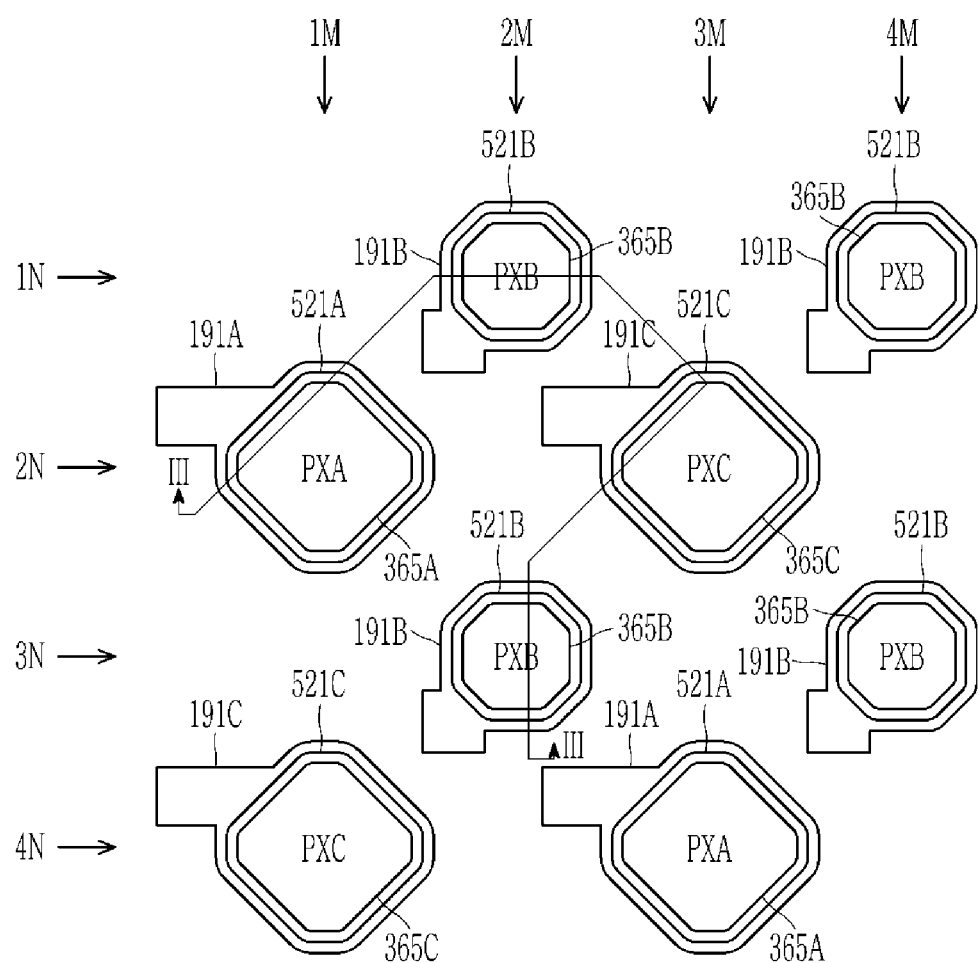
FIG. 2 is a schematic layout view showing a part of a display device according to an embodiment.
Figure 3:
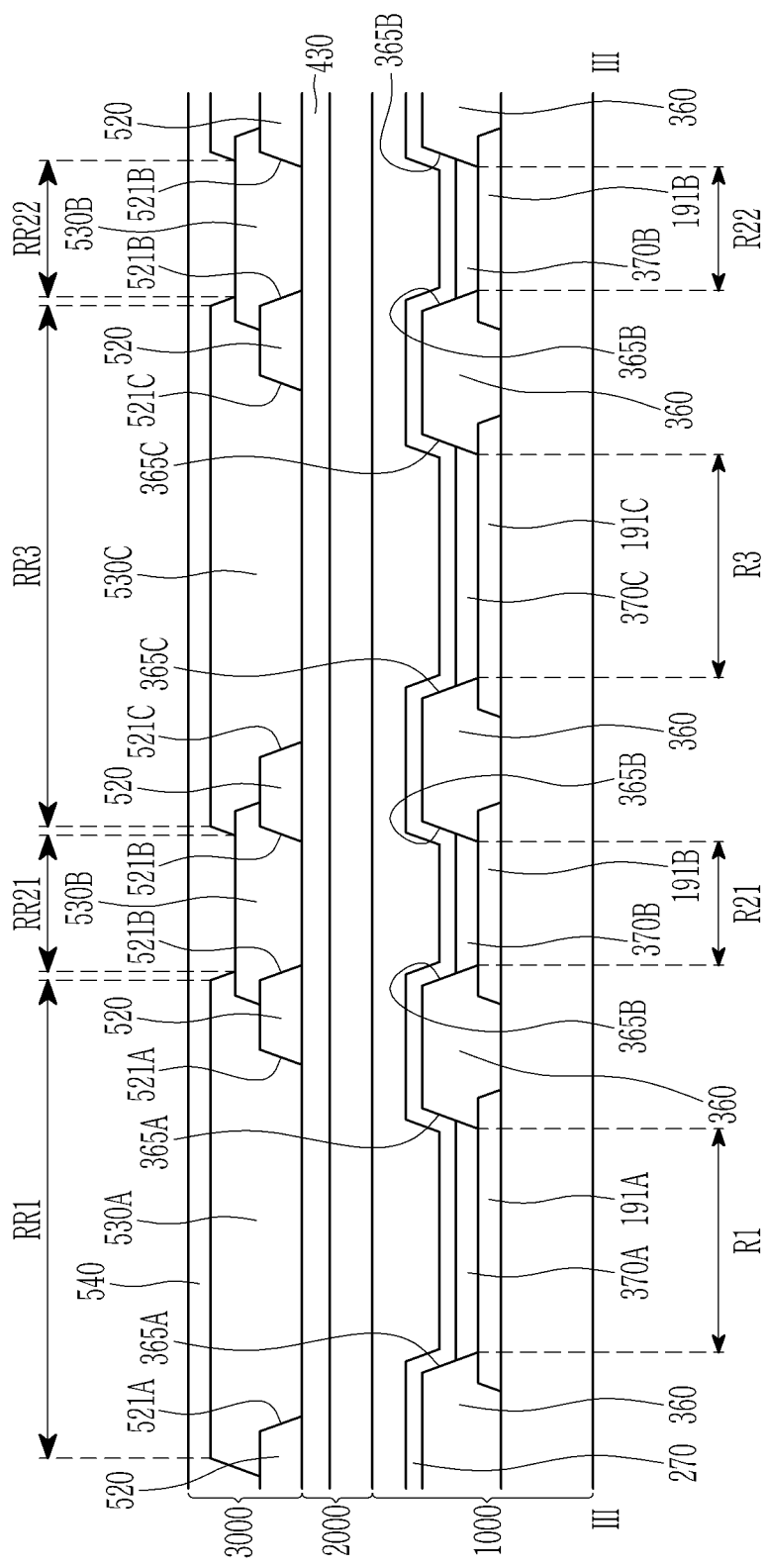
FIG. 3 is a schematic cross-sectional view taken along line of FIG. 2.

The arrangement of the pixel opening 365 of the pixel definition layer 360 of the display unit 1000 and the anti-reflection unit 3000 is described with reference to FIGS. 2 and 3. FIG. 2 is a schematic layout view showing a part of a display device according to an embodiment, and FIG. 3 is a schematic cross-sectional view taken along line of FIG. 2.

First, the pixel arrangement of the display device according to an embodiment is described with reference to FIG. 2.

As shown in FIG. 2, the display device may include first pixels PXA, second pixels PXB, and third pixels PXC, which display different colors.

In the first row 1N of the display device, second pixels PXB may be disposed at a predetermined interval, in the adjacent second row 2N, first pixels PXA and third pixels PXC may be alternately disposed one by one, in the adjacent third row 3N, second pixels PXB may be disposed at a predetermined interval, in the adjacent fourth row 4N, the first pixel PXA and the third pixel PXC may be alternately disposed, and the arrangement of these pixels may be repeated to the N-th row.

The second pixels PXB disposed in the first row 1N and the first pixels PXA and the third pixels PXC disposed in the second row 2N may be disposed in zigzags. Therefore, the first pixel PXA and the third pixel PXC may be alternately disposed in the first column 1M, the second pixels PXB may be disposed at a predetermined interval in the adjacent second column 2M, the first pixel PXA and the third pixel PXC may be alternately disposed in the adjacent third column 3M, the second pixels PXB may be disposed at a predetermined interval in the adjacent fourth column 4M, and the arrangement of these pixels may be repeated up to the M-th column.

The first row 1N and the first column 1M described above do not represent a first row and a first column, but represent rows and columns of an arbitrary region.

This pixel arrangement structure is referred to as a PenTile® Matrix, and by expressing colors by sharing adjacent pixels, high resolution may be achieved with a smaller number of pixels.

For example, the first pixel PXA may be a red pixel displaying red, the second pixel PXB may be a green pixel displaying green, and the third pixel PXC may be a blue pixel displaying blue. However, this is an example, and the color displayed by each pixel may be changed.

The arrangement of the pixel opening 365 of the pixel definition 360 of the display unit 1000 and the anti-reflection unit 3000 is described with reference to FIGS. 2 and 3.

As mentioned above, the pixel definition layer 360 may be disposed on a first pixel electrode 191A of the first pixel PXA, a second pixel electrode 191B of the second pixel PXB, and a third pixel electrode 191C of the third pixel PXC. The pixel definition layer 360 may include a first pixel opening 365A overlapping the first pixel electrode 191A of the first pixel PXA, a second pixel opening 365B overlapping the second pixel electrode 191B of the second pixel PXB, and a third pixel opening 365C overlapping the third pixel electrode 191C of the third pixel PXC. In an embodiment, multiple first pixel openings 365A may each overlap corresponding one of multiple first pixel electrodes 191A, multiple second pixel openings 365B may each overlap corresponding one of multiple second pixel electrodes 191B, and multiple third pixel openings 365C may each overlap corresponding one of multiple third pixel electrodes 191C.

A first organic emission layer 370A, a second organic emission layer 370B, and a third organic emission layer 370C may be disposed in the first pixel opening 365A, the second pixel opening 365B, and the third pixel opening 365C, respectively.

A common electrode 270 may be disposed on the pixel definition layer 360, the first organic emission layer 370A, the second organic emission layer 370B, and the third organic emission layer 370C.

The blocking layer 520 of the anti-reflection unit 3000 may be disposed to overlap the pixel definition layer 360. The width of the blocking layer 520 may be narrower than that of the pixel definition layer 360.

The blocking layer 520 may include a first opening 521A overlapping the first organic emission layer 370A, a second opening 521B overlapping the second organic emission layer 370B, and a third opening 521C overlapping the third organic emission layer 370C.

The first opening 521A of the blocking layer 520 may overlap the first pixel opening 365A of the pixel definition layer 360, the second opening 521B may overlap the second pixel opening 365B, and the third opening 521C may overlap the third pixel opening 365C. In an embodiment, multiple first openings 521A may each overlap corresponding one of multiple first pixel openings 365A, multiple second openings 521B may each overlap corresponding one of multiple second pixel openings 365B, and multiple third openings 521C may each overlap corresponding one of third pixel openings 365C.

The area of the first opening 521A may be wider than that of the first pixel opening 365A, the area of the second opening 521B may be wider than that of the second pixel opening 365B, and the area of the third opening 521C may be wider than that of the third pixel opening 365C.

Since the width of the blocking layer 520 may be narrower than that of the pixel definition layer 360, the blocking layer 520 may prevent the external light from entering the pixel definition layer 360 and being reflected and visually recognized without interfering with the light emitted from the first organic emission layer 370A, the second organic emission layer 370B, and the third organic emission layer 370C, thereby preventing a deterioration in contrast due to the reflection of external light.

The first color filter 530A may be disposed in the first opening 521A of the blocking layer 520, the second color filter 530B may be disposed in the second opening 521B, and the third color filter 530C may be disposed in the third opening 521C. In an embodiment, multiple first color filters 530A may each be disposed in corresponding one of multiple first openings 521A, multiple second color filters 530B may each be disposed in corresponding one of multiple second openings 521B, and multiple third color filters 530C may each be disposed in corresponding one of multiple third openings 521C.

The first color filter 530A, the second color filter 530B, and the third color filter 530C may transmit light having substantially the same wavelength as the light emitted from the first organic emission layer 370A, the second organic emission layer 370B, and the third organic emission layer 370C, respectively. The first color filter 530A, the second color filter 530B, and the third color filter 530C may prevent light incident from the outside from being reflected by the display unit 1000 and externally recognized without significantly interfering with the path of light emitted from the first organic emission layer 370A, the second organic emission layer 370B, and the third organic emission layer 370C, thereby preventing deterioration in the transmittance while preventing reduction in the contrast of the display device.

On the blocking layer 520, the first color filter 530A and the second color filter 530B may overlap each other, the second color filter 530B and the third color filter 530C may overlap each other, and the third color filter 530C and the first color filter 530A may overlap each other.

In a dot DOT including a first pixel PXA, two second pixels PXB, and a third pixel PXC, the area R1 of the first pixel opening 365A of the first pixel PXA may be smaller than the sum of the areas R21 and R22 of second pixel openings 365B of the two second pixels PXB. The area R3 of the third pixel opening 365C of the third pixel PXC may be smaller than the sum of the areas R21 and R22 of second pixel openings 365B of two second pixels PXB. For example, a ratio of the area R1 of a first pixel opening 365A, the sum of the areas R21 and R22 of two second pixel openings 365B, and the area R3 of the third pixel opening 365C of a third pixel PXC may be about 1:1.2:1.1 or about 1:1.3:0.9.

The area RR1 of the first color filter 530A of the first pixel PXA may be larger or smaller than the sum of the areas RR21 and RR22 of two second color filters 530B of two second pixels PXB. The area RR3 of the third color filter 530C of the third pixel PXC may be larger or smaller than the sum of areas RR21 and RR22 of two second color filters 530B of two second pixels PXB. Since the color filters 530A, 530B, and 530C may be disposed mainly in the opening of the blocking layer 520, similar to the area of the color filter, the area of a first opening 521A of the blocking layer 520 may be larger than the sum of the areas of two second openings 521B, and the area of a third opening 521C may be larger or smaller than the sum of the area of two second openings 521B.

Likewise, in a plan view of the display device, differentiating the ratio of the area of the pixel opening of the pixel definition layer, in which the organic emission layer of each pixel is disposed, and the ratio of the area of the color filter of each pixel, may prevent the color perception and the contrast ratio from being deteriorated by light of a specific color visually recognized.

For example, according to the display device of the embodiment, the second color filters 530B overlapping the second pixel openings 365B of the second pixels PXB having a relatively larger area may be formed to have narrower areas RR21 and RR22 thereof, and thus, the color of the second pixel PXB having a larger area of an emissive region may be more visible than other colors, thereby preventing the visibility from being reduced.

While the dot DOT including one first pixel PXA, two second pixels PXB, and a third pixel PXC is discussed above, when considering the entire display device, it is also applicable to the ratio of the sum of the areas of multiple pixel openings of first pixels PXA, second pixels PXB, and third pixels PXC and the ratio of the sum of the areas of color filters.

Figure 4:
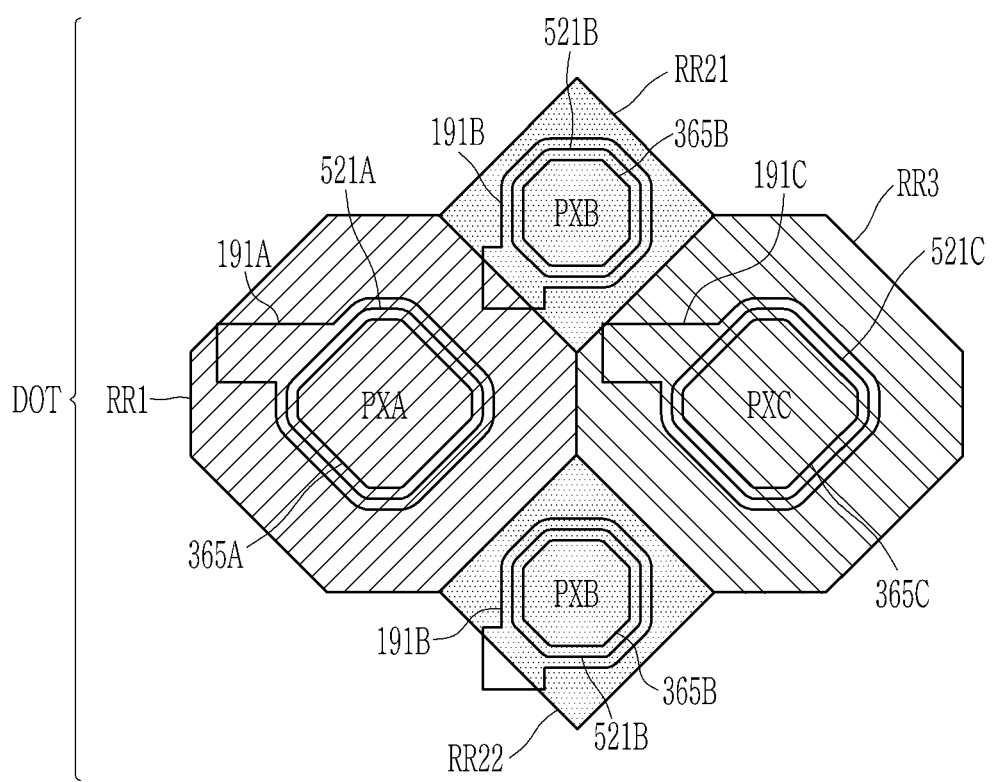
FIG. 4 is a schematic plan view showing a part of a display device.
Figure 5:
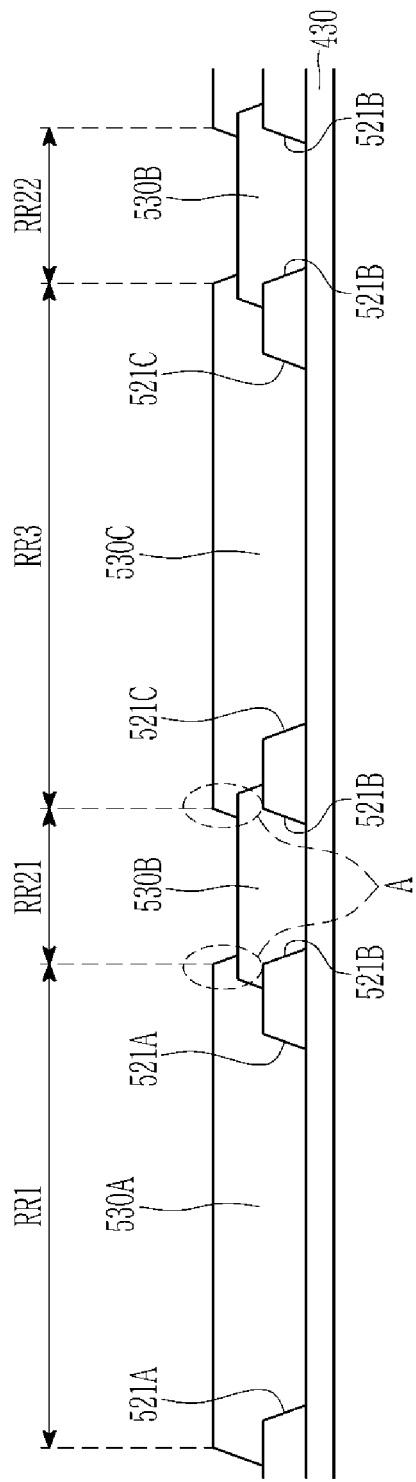
FIG. 5 is a schematic cross-sectional view showing a part of FIG. 4.

The area of the color filter is described with reference to FIGS. 4 and 5 along with FIGS. 2 and 3. FIG. 4 is a schematic plan view showing a part of a display device, and FIG. 5 is a schematic cross-sectional view showing a part of FIG. 4. FIGS. 4 and 5 show a first pixel PXA, two second pixels PXB, and a third pixel PXC forming a dot DOT.

In FIG. 4, the area where each color filter 530A, 530B, or 530C is recognized is indicated by hatching. In FIG. 4, each of the first color filter 530A and the third color filter 530C may have an octagonal planar shape substantially close to a quadrangle, and each of two second color filters 530B may have a rhombic shape, but this is an example, and the shape of each color filter 530A, 530B, or 530C may be changeable.

Similar to that described with reference to FIGS. 2 and 3, referring to FIGS. 4 and 5, the first color filter 530A may be disposed in the first opening 521A of the blocking layer 520, the second color filter 530B may be disposed in the second opening 521B, and the third color filter 530C may be disposed in the third opening 521C. The overlapping part of the color filter may be disposed on the blocking layer 520. Referring to part A, the first color filter 530A and the third color filter 530C may be disposed on the second color filter 530B in the overlapping part of the color filter.

The area RR1 of the first color filter 530A of the first pixel PXA may be larger than the sum of the areas RR21 and RR22 of two second color filters 530B of two second pixels PXB. The area RR3 of the third color filter 530C of the third pixel PXC may be larger or smaller than, or substantially the same as, the sum of the areas RR21 and RR22 of two second color filters 530B of two second pixels PXB. For example, based on the area RR1 of the first color filter 530A of the first pixel PXA, the ratio of the sum of the areas RR21 and RR22 of two second color filters 530B to the area RR1 of the first color filter 530A of the first pixel PXA may be about 0.5 to about 0.8, and the ratio of the area RR3 of the third color filter 530C of the third pixel PXC of the area RR1 of the first color filter 530A of the first pixel PXA may be about 0.5 to about 1.

As described above, the ratio of the area R1 of a first pixel opening 365A, the sum of the areas R21 and R22 of two second pixel openings 365B, and the area R3 of a third pixel opening 365C of a third pixel PXC may be about 1:1.2:1.1 or about 1:1.3:0.9.

Since the area of the pixel opening is relatively large, the second color filter 530B that transmits light having the wavelength equal to that of the light emitted from the second organic emission layer 370B of the second pixel PXB where the region occupied by the emissive region is relatively large may be formed to have a relatively small area, and thus, among the light incident from the outside of the display device and reflected, the light having the wavelength equal to that of the light emitted from the second organic emission layer 370B may be relatively less. Accordingly, the same color as that displayed by the second pixel PXB in which the region occupied by the emissive region is large may be recognized such that the contrast ratio or the color perception may be prevented from being deteriorated.

Referring to FIG. 5, the overlapping part of the color filter may be disposed on the blocking layer 520. Referring to part A of FIG. 5, the first color filter 530A and the third color filter 530C may be disposed on the second color filter 530B in the overlapping part of the color filter. Accordingly, the second color filter 530B may be overlapped by the first color filter 530A and the third color filter 530C in the overlapping part, without significantly reducing the area of the second color filter 530B. In a plan view of the display device, the area of the second color filter 530B may be relatively small. In an embodiment, the color filters may be alternately disposed above and below each other in the overlapping part.

Likewise, according to an embodiment, the anti-reflection unit 3000 may include the blocking layer 520 overlapping the pixel definition layer 360 and having a narrower width than the pixel definition layer 360, and the first to third color filters 530A to 530C disposed in the first to third openings 521A to 521C of the blocking layer 520 and overlapping the first to third organic emission layers 370A to 370C, respectively. Since the blocking layer 520 may have a narrower width than the pixel definition layer 360, and the first to third color filters 530A to 530C may transmit light having the wavelength that is substantially equal to that of the light emitted from the first to third organic emission layers 370A to 370C, respectively, the anti-reflection unit 3000 may prevent the light incident from the outside from being reflected by the display unit 1000 and recognized from the outside without significantly interfering with light emitted from the first to third organic emission layers 370A to 370C, thereby preventing deterioration in the transmittance while preventing deterioration in the contrast of the display device.

In a plan view of the display device, differentiating the ratio of the area of the pixel opening of the pixel definition layer where the organic emission layer of each pixel is disposed and the ratio of the area of the color filter of each pixel, may prevent the specific color from being visually recognized in the anti-reflection unit, the color perception from being deteriorated, and the contrast ratio from being deteriorated.

While a dot DOT including a first pixel PXA, two second pixels PXB, and a third pixel PXC constituting a dot is discussed above, it is also applicable to the area ratio of multiple pixel openings of first pixels PXA, second pixels PXB, and third pixels PXC and the area ratio of multiple color filters in a plan view.

Figure 6:
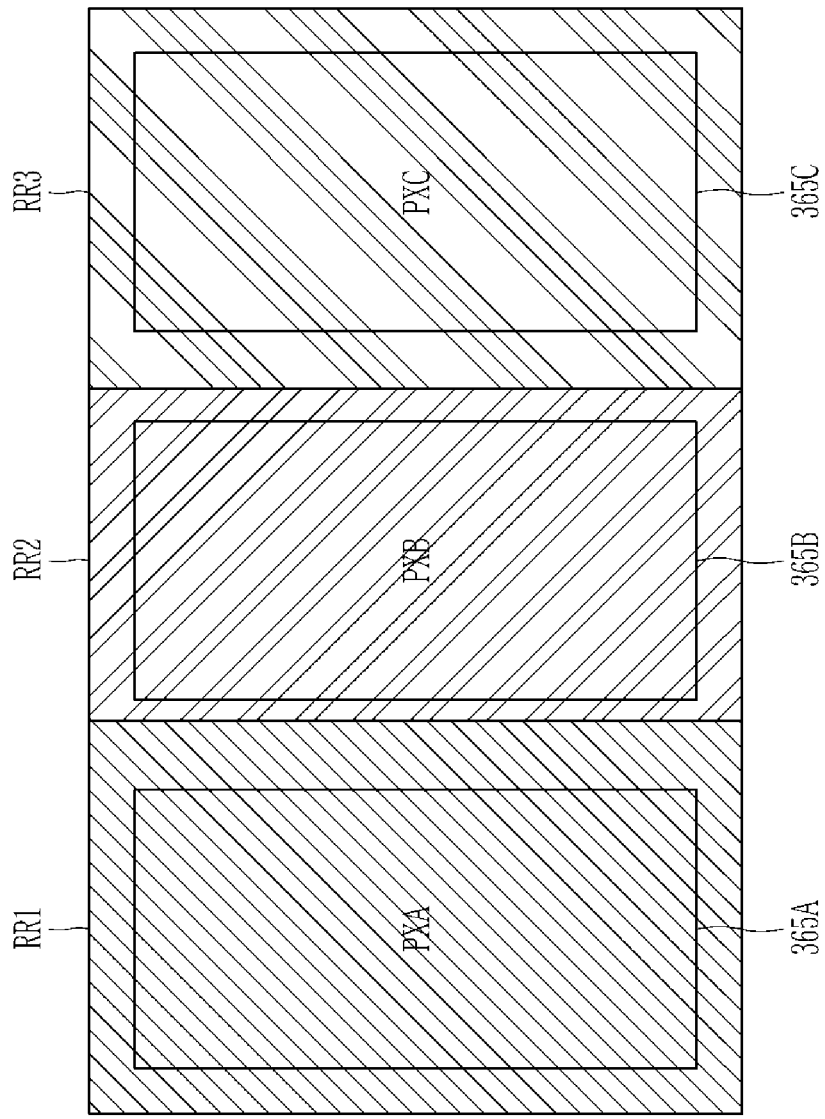
FIG. 6 is a schematic plan view showing a part of a display device according to another embodiment.

The display device according to another embodiment is briefly described with reference to FIG. 6. FIG. 6 is a schematic plan view showing a part of a display device according to another embodiment.

FIG. 6 shows the pixel openings of the pixels forming a dot DOT and the area occupied by the color filter of the anti-reflection unit. Many of the features of the elements according to the embodiment described above are applicable to the embodiments. Therefore, repetitive descriptions are omitted.

Referring to FIG. 6, the display device according to the embodiment may include a first pixel PXA, a second pixel PXB, and a third pixel PXC forming a dot DOT.

The area of the first pixel opening 365A of the pixel definition layer defining the light emission region of the first pixel PXA, the area of the second pixel opening 365B of the pixel definition layer defining the light emission region of the second pixel PXB, and the area of the third pixel opening 365C of the pixel definition layer defining the light emission region of the third pixel PXC may be substantially equal to each other.

In contrast, in the area of the color filter of the anti-reflection unit, the area RR1 of the first color filter 530A overlapping the first pixel opening 365A of the first pixel PXA may be largest, and the area RR2 of the second color filter 530B overlapping the second pixel opening 365B of the second pixel PXB may be smallest. The area RR3 of the third color filter 530C overlapping the third pixel opening 365C of the third pixel PXC may be approximately equal to or slightly smaller than the area RR1 of the first color filter 530A.

For example, the first pixel PXA may be a red pixel displaying red, the second pixel PXB may be a green pixel displaying green, and the third pixel PXC may be a blue pixel displaying blue. However, this is an example, and the color displayed by each pixel may be changeable.

According to the embodiment, the anti-reflection unit 3000 may prevent the light incident from the outside from being reflected by the display unit 1000 and visually recognized from the outside without significantly interfering with the light emitted from the first to third organic emission layers 370A to 370C, thereby preventing deterioration in the transmittance while preventing reduction in the contrast of the display device, and in a plan view, differentiating the ratio of the area of the pixel opening area of the pixel definition layer where the organic emission layer of each pixel is disposed and the ratio of the area of the color filter of each pixel may prevent the color perception and the contrast ratio from being deteriorated by the specific color visually recognized from the anti-reflection unit.

While a dot DOT including one first pixel PXA, one second pixel PXB, and one third pixel PXC is discussed above, it is also applicable to the area ratio of multiple pixel openings of first pixels PXA, second pixels PXB, and third pixels PXC and the area ratio of multiple color filters in a plan view.

Many of the features according to the embodiment described above are applicable to the display device according to the embodiment.

Figure 7:
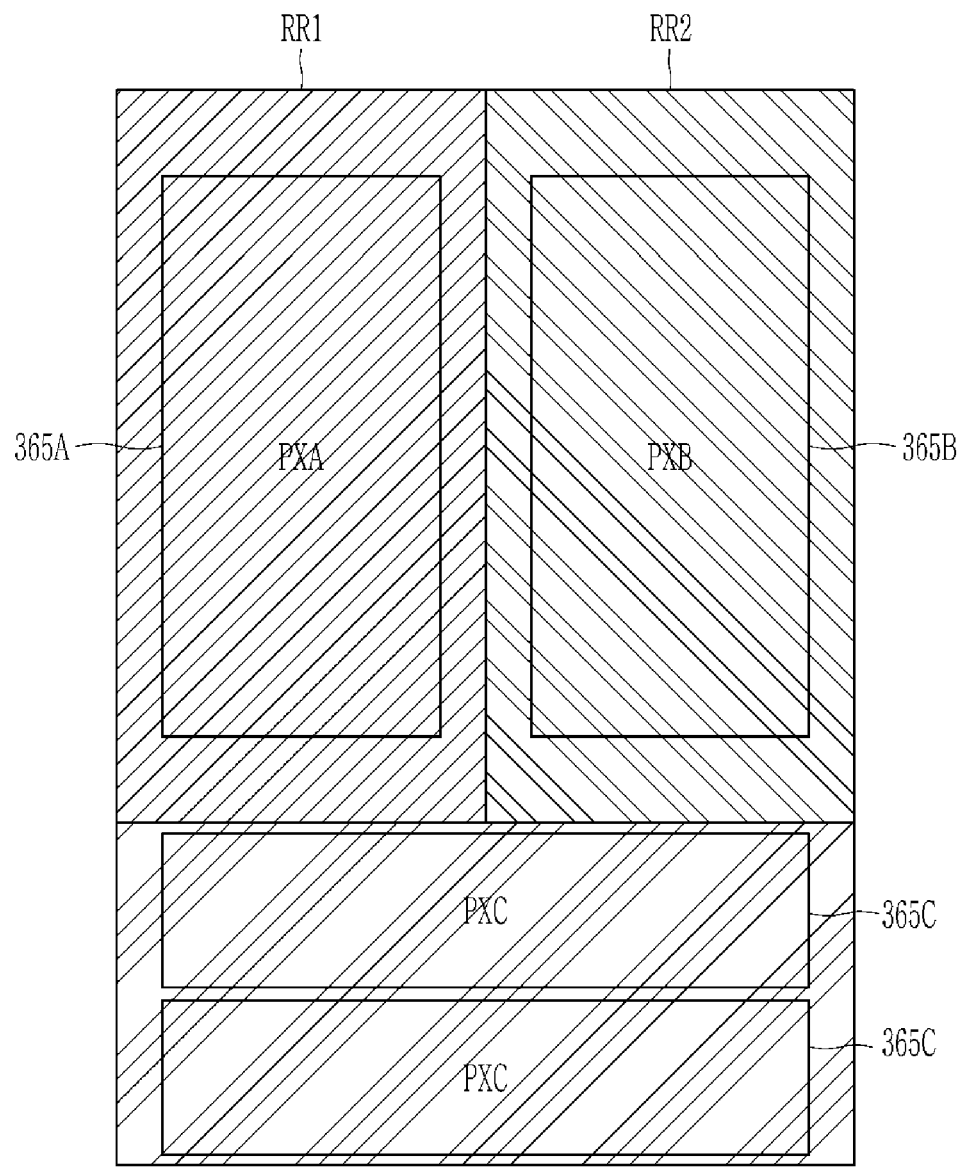
FIG. 7 is a schematic plan view showing a part of a display device according to another embodiment.

The display device according to another embodiment is described with reference to FIG. 7. FIG. 7 is a schematic plan view showing a part of a display device according to another embodiment.

FIG. 7 shows the pixel openings of the pixels forming a dot DOT and the area occupied by the color filter of the anti-reflection unit. Many of the features of the elements according to the embodiment described above are applicable to the embodiment. Therefore, repetitive descriptions are omitted.

Referring to FIG. 7, the display device according to the embodiment may include a first pixel PXA, a second pixel PXB, and two third pixels PXC constituting a dot DOT.

The area of the first pixel opening 365A of the pixel definition layer defining the light emission region of the first pixel PXA and the area of the second pixel opening 365B of the pixel definition layer defining the light emission region of the second pixel PXB may be substantially equal to each other. However, the areas may be smaller than the sum of the areas of two third pixel openings 365C of the pixel definition layer defining the light emission region of two third pixels PXC.

In contrast, in the area of the color filter of the anti-reflection unit, the area RR1 of the first color filter 530A overlapping the first pixel opening 365A of the first pixel PXA and the area RR2 of the second color filter 530B overlapping the second pixel opening 365B of the second pixel PXB may be substantially the same. The area RR3 of the third color filters 530C overlapping the third pixel openings 365C of two third pixels PXC may be smaller than the area RR1 of the first color filter 530A and the area RR2 of the second color filter 530B.

For example, the first pixel PXA may be a red pixel displaying red, the second pixel PXB may be a green pixel displaying green, and the third pixel PXC may be a blue pixel displaying blue. However, this is an example, and the color displayed by each pixel may be changeable.

According to the embodiment, the anti-reflection unit 3000 may prevent the light incident from the outside from being reflected by the display unit 1000 and visually recognized from the outside without significantly interfering with the path of light emitted from the first to third organic emission layers 370A to 370C, thereby preventing deterioration in the transmittance while preventing reduction in the contrast of the display device, and in a plan view, differentiating the ratio of the area of the pixel opening area of the pixel definition layer where the organic emission layer of each pixel is disposed and the ratio of the area of the color filter of each pixel may prevent the color perception and the contrast ratio from being deteriorated by the specific color recognized from the anti-reflection unit.

While a dot DOT including a first pixel PXA, a second pixel PXB, and a third pixel PXC is discussed above, it is also applicable to the area ratio of multiple pixel openings of first pixels PXA, second pixels PXB, and third pixels PXC and the area ratio of multiple color filters in a plan view.

Many of the features according to the embodiment described above are applicable to the display device according to the embodiment.

An experimental example is described with reference to FIGS. 9A to 9C along with FIGS. 8A to 8C.

In the experimental example, a dot DOT may include a red pixel, two green pixels, and a blue pixel, and the area of the pixel opening of the pixel definition layer as the area of the emissive region of the red pixel, the sum of the areas of the pixel openings of two green pixels, and the area of the pixel opening of the blue pixel may have the ratio of 1:1.63:0.91.

In a first case (case 1), the area of the red color filter of the anti-reflection unit overlapping the red pixel, the sum of the areas of two green color filters of the anti-reflection unit overlapping the two green pixels, and the area of the blue color filter of the anti-reflection unit overlapping the blue pixel has the ratio of 1:1.63:0.91 as the ratio of the areas of the pixel openings; in a second case (case 2), they have the ratio of 1:0.59:0.52; and in a third case (case 3), they have the ratio of 1:0.59:1. The color coordinates of the reflected external light and color perception for reflection of the external light in the display device were measured in the first, second, and third cases (cases 1 to 3). FIGS. 8A to 8C are graphs showing the color coordinates of the reflected external light in the first case (case 1), the second case (case 2), and the third case (case 3), and FIGS. 9A to 9C are photos showing the reflected external light in the first case (case 1), the second case (case 2), and the third case (case 3).

Figure 8A:
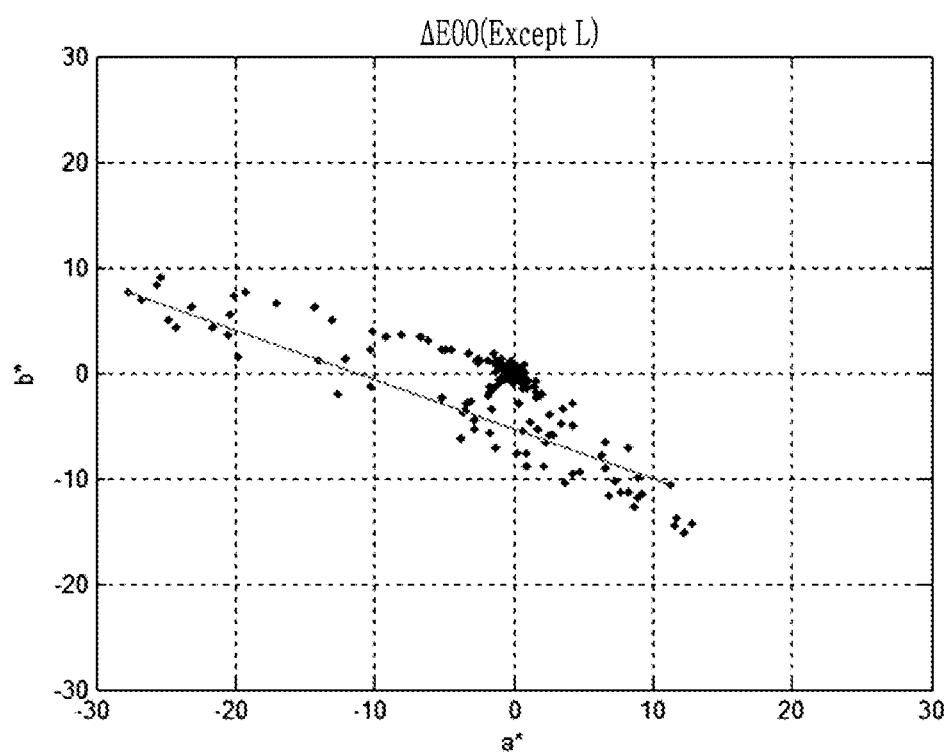
FIG. 8A to FIG. 8C are graphs showing a result of an experimental example.
Figure 9A:
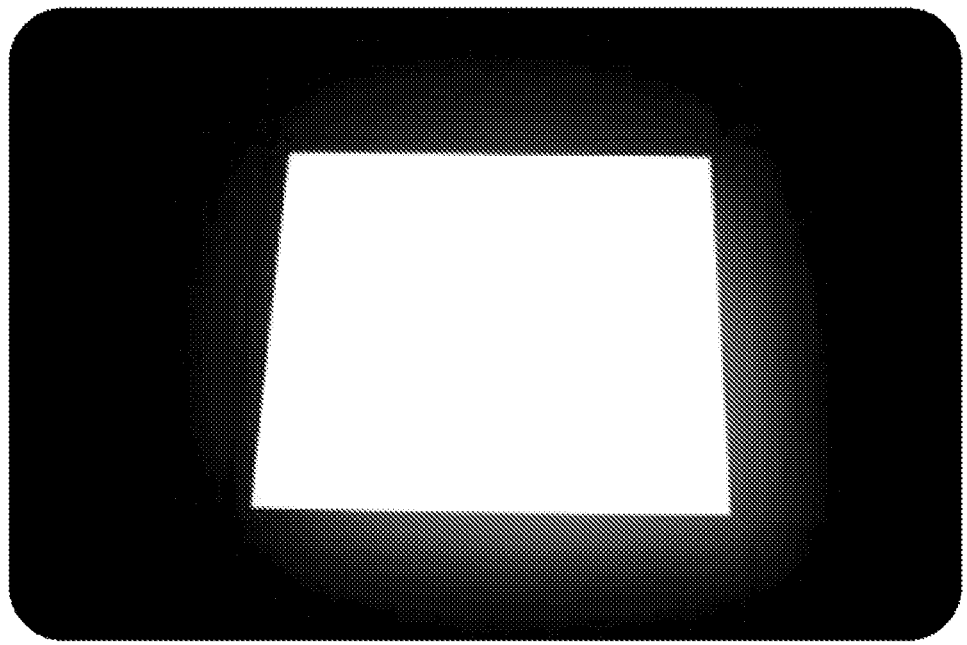
FIG. 9A to FIG. 9C are photos showing a result of an experimental example.
Figure 9B:
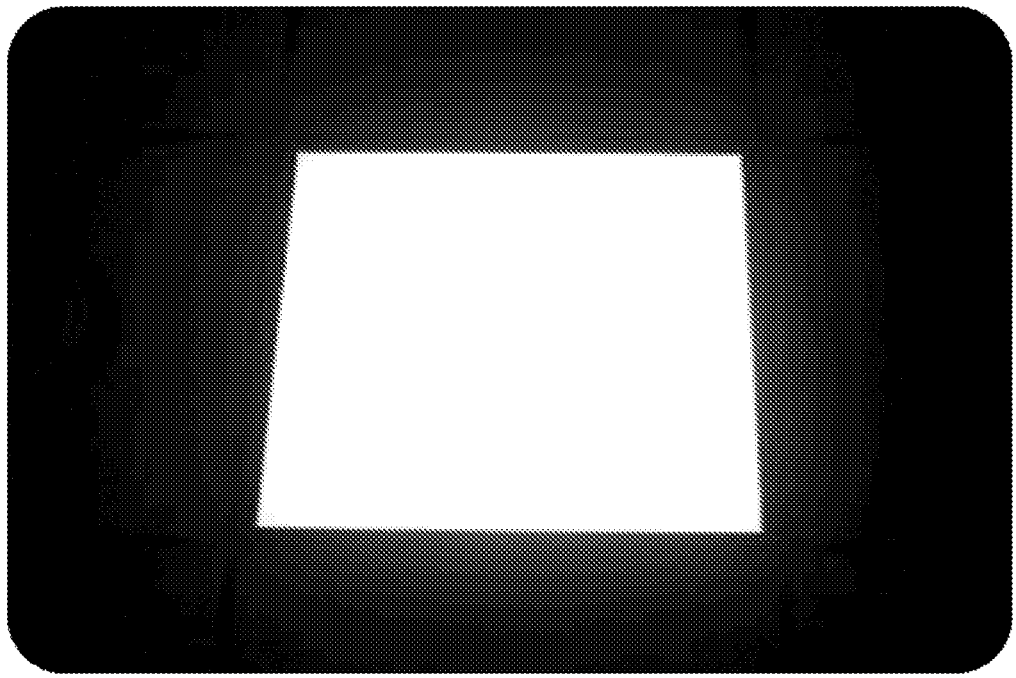
Figure 9C:
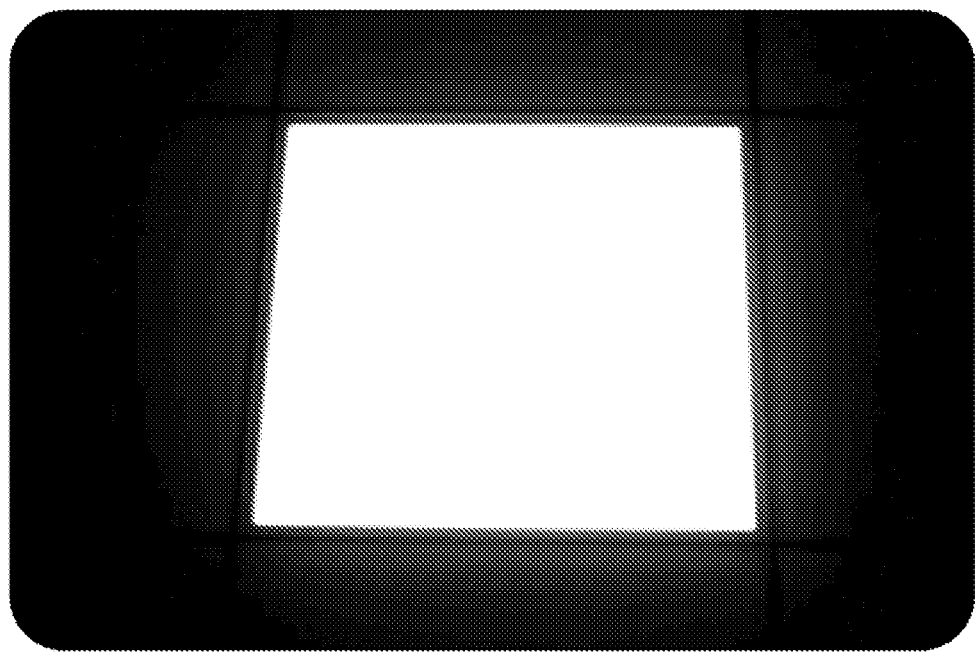

Referring to FIG. 8A, it can be seen that the color coordinates measured in the first case (case 1) were diffused toward a green side and a magenta side, and a maximum color difference was about 22.67. Referring to FIG. 9A, it can be seen that a green stripe as external light reflection appears around the edge of the device in the first case (case 1).

As described above, in case that the ratio of the area of the pixel opening of the pixel definition layer and the ratio of the area of the color filter of the anti-reflection unit is the same, the light having the same wavelength as that of the light emitted by the pixel having a relatively large area is visually recognized and the color perception may be deteriorated, and it can also be seen that the reflection stripe is visually recognized from the reflected external light and the contrast was deteriorated.

Figure 8B:
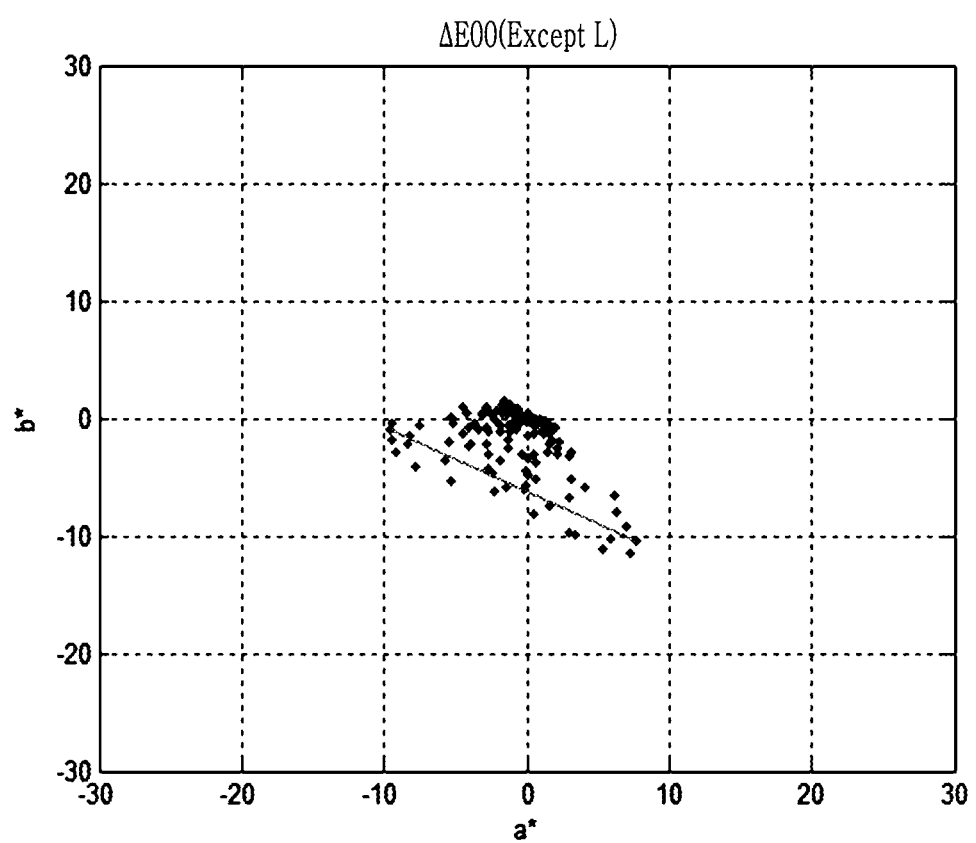
Figure 8C:
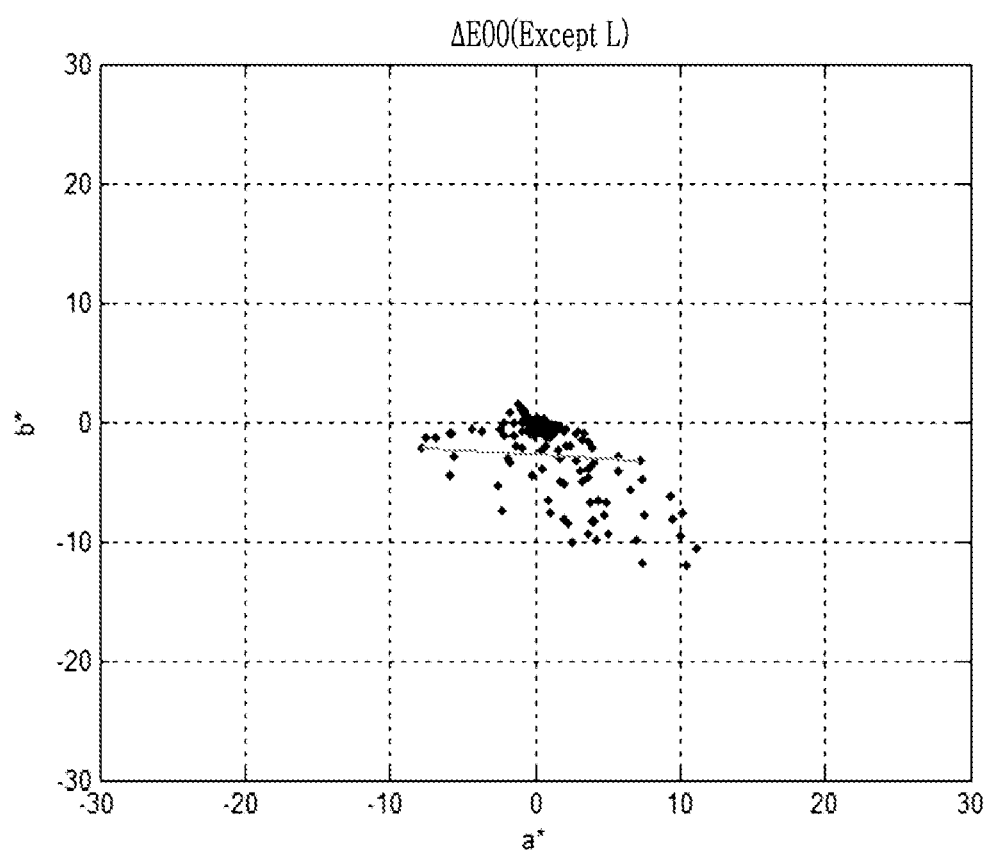

In contrast, referring to FIGS. 8B and 8C, according to the second case (case 2) and the third case (case 3), it can be seen that the color coordinates are not substantially changed and are appeared at the center and that the maximum color difference is reduced to about 13.98, reducing deterioration in the color perception. Referring to FIGS. 9B and 9C, according to the second case (case 2) and the third case (case 3), it can be seen that the reflection stripe of a specific color is not recognized and the contrast was prevented from being deteriorated.

As above-described, in a plan view, differently forming the ratio of the area of the pixel opening of the pixel definition layer where the organic emission layer of each pixel is disposed and the ratio of the area of the color filter of each pixel may prevent the color perception and the contrast ratio from being deteriorated by the light of the specific color visually recognized from the anti-reflection unit.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:
1. A display device comprising:
a display unit including:
a plurality of first emissive regions displaying a first color;
a plurality of second emissive regions displaying a second color; and
a plurality of third emissive regions displaying a third color; and
an anti-reflection unit overlapping the display unit and including:
a plurality of first color filters overlapping the plurality of first emissive regions;
a plurality of second color filters overlapping the plurality of second emissive regions;
a plurality of third color filters overlapping the plurality of third emissive regions; and
a blocking layer that absorbs incident external light and is disposed under the plurality of first color filters, the plurality of second color filters, or the plurality of third color filters, wherein
in a plan view, a ratio of a sum of areas of the plurality of first emissive regions, and a sum of areas of the plurality of second emissive regions, and a sum of areas of the plurality of third emissive regions, and a ratio of a sum of areas of the plurality of first color filters, a sum of areas of the plurality of second color filters, and a sum of areas of the plurality of third color filters are different.

2. The display device of claim 1, wherein
the sum of areas of the plurality of first emissive regions is smaller than the sum of areas of the plurality of second emissive regions, and
the sum of areas of the plurality of first color filters is larger than the sum of areas of the plurality of second color filters.

3. The display device of claim 2, wherein
the sum of areas of the plurality of third emissive regions is smaller than the sum of areas of the plurality of second emissive regions, and
the sum of areas of the plurality of third color filters is larger than the sum of areas of the plurality of second color filters.

4. The display device of claim 2, wherein
the blocking layer includes a plurality of openings overlapping the plurality of first color filters, the plurality of second color filters, and the plurality of third color filters,
a first overlapping part is disposed on the blocking layer, the plurality of first color filters and the plurality of second color filters overlapping each other in the first overlapping part,
a second overlapping part is disposed on the blocking layer, the plurality of second color filters and the plurality of third color filters overlapping each other in the second overlapping part,
the plurality of first color filters are disposed on the plurality of second color filters at the first overlapping part, and
the plurality of third color filters are disposed on the plurality of second color filters at the second overlapping part.

5. The display device of claim 2, wherein
a first emissive region of the plurality of first emissive regions, two second emissive regions of the plurality of second emissive regions, and a third emissive region of the plurality of third emissive regions form a dot.

6. The display device of claim 5, wherein
the two second emissive regions are spaced apart from each other and disposed in a first row,
the first emissive region and the third emissive region are spaced apart from each other and disposed in a second row adjacent to the first row, and
the two second emissive regions disposed in the first row and the first emissive region and the third emissive region disposed in the second row are alternately disposed in zigzags.

7. The display device of claim 6, wherein
the first color is red,
the second color is green, and
the third color is blue.

8. The display device of claim 5, wherein
the first emissive region and the third emissive region are disposed adjacent to each other,
the two second emissive regions are disposed under the first emissive region and the third emissive region,
the first color is red,
the second color is blue, and
the third color is green.

9. The display device of claim 1, wherein
a first emissive region of the plurality of first emissive regions, a second emissive region of the plurality of second emissive regions, and one third emissive region of the plurality of third emissive regions form a dot.

10. A display device comprising:
a plurality of pixels including:
a plurality of first pixels displaying a first color;
a plurality of second pixels displaying a second color; and
a plurality of third pixels displaying a third color, wherein
a first pixel of the plurality of first pixels, two second pixels of the plurality of second pixels, and one third pixel of the plurality of third pixels form a dot,
the plurality of first pixels each includes:
a first emissive region emitting a first color; and
a first color filter overlapping the first emissive region and transmitting light of the first color,
the plurality of second pixels each includes:
a second emissive region emitting a second color; and
a second color filter overlapping the second emissive region and transmitting light of the second color, and
the plurality of third pixels each includes:
a third emissive region emitting a third color; and
a third color filter overlapping the third emissive region and transmitting light of the third color,
in a plan view, an area of the first emissive region of the first pixel is less than a sum of areas of two second emissive regions of the two second pixels,
in the plan view, an area of the third emissive region of the third pixel is less than the sum of the areas of the two second emissive regions of the two second pixels, and
in the plan view, an area of the first color filter of the first pixel is larger than a sum of areas of two second color filters of the two second pixels.

11. The display device of claim 10, wherein
a ratio of the area of the first emissive region of the first pixel, the sum of the areas of the two second emissive regions of the two second pixels, and the area of the third emissive region of the third pixel is about 1:1.2:1.1 or about 1:1.3:0.9.

12. The display device of claim 11, wherein
the ratio of the sum of the areas of the two second color filter of the two second pixels to the area of the first color filter of the first pixel is about 0.5 to about 0.8.

13. The display device of claim 12, wherein
the ratio of an area of the third color filter of the third pixel to the area of the first color filter of the one first pixel is about 0.5 to about 1.

14. The display device of claim 13, wherein
the two second emissive regions are spaced apart from each other and disposed in the first row,
the first emissive region and the third emissive region are spaced apart from each other and disposed in a second row adjacent to the first row, and
the two second emissive regions disposed in the first row and the first emissive region and the third emissive region disposed in the second row are alternately disposed in zigzags.

15. The display device of claim 14, wherein
the first color is red,
the second color is green, and
the third color is blue.

16. A display device comprising:
a pixel electrode including: a plurality of first pixel electrodes, a plurality of second pixel electrodes, and a plurality of third pixel electrodes disposed on a substrate;
a pixel definition layer disposed on the substrate and including:

a plurality of first pixel openings overlapping the plurality of first pixel electrodes;
a plurality of second pixel openings overlapping the plurality of second pixel electrodes; and
a plurality of third pixel openings overlapping the plurality of third pixel electrodes;

an emissive region including:
a plurality of first emissive regions disposed in the plurality of first pixel openings and displaying a first color;
a plurality of second emissive regions disposed in the plurality of second pixel openings and displaying a second color; and
a plurality of third emissive regions disposed in the plurality of third pixel openings and displaying a third color;

a common electrode disposed on the emissive region;
an encapsulation layer disposed on the common electrode and overlapping the emissive region;
a blocking layer disposed on the encapsulation layer and including:
a plurality of first openings overlapping the plurality of first pixel openings;
a plurality of second openings overlapping the plurality of second pixel openings, and
a plurality of third openings overlapping the plurality of third pixel openings; and a color filter including:
a plurality of first color filters disposed in the plurality of first openings and transmitting light of the first color;
a plurality of second color filters disposed in the plurality of second openings and transmitting light of the second color; and
a plurality of third color filters disposed in the plurality of third openings and transmitting light of the third color, wherein in a plan view, a ratio of a sum of areas of the plurality of first emissive regions, a sum of areas of the plurality of second emissive regions, and a sum of areas of the plurality of third emissive regions and a ratio of a sum of areas of the plurality of first color filters, a sum of areas of the plurality of second color filters, and a sum of areas of the plurality of third color filters are different, and the blocking layer absorbs incident external light and is disposed under the plurality of first color filters, the plurality of second color filters, or the plurality of third color filters.

17. The display device of claim 16, wherein
the sum of areas of the plurality of first emissive regions is smaller than the sum of areas of the plurality of second emissive regions, and
the sum of areas of the plurality of first color filters is larger than the sum of areas of the plurality of second color filters.

18. The display device of claim 17, wherein
a first emissive region of the plurality of first emissive regions, two second emissive regions of the plurality of second emissive regions, and a third emissive region of the plurality of third emissive regions form a dot,
the two second emissive regions are spaced apart from each other and disposed in a first row,
the first emissive region and the third emissive region are spaced apart from each other and disposed in a second row adjacent to the first row, and
the two second emissive regions disposed in the first row, and the one first emissive region and the third emissive region disposed in the second row are alternately disposed in zigzags.

19. The display device of claim 17, wherein
a first emissive region of the plurality of first emissive regions and a third emissive region of the plurality of third emissive region are disposed adjacent to each other,
two second emissive regions of the plurality of second emissive regions are disposed under the first emissive region and the third emissive region,
the plurality of first emissive regions display red,
the plurality of second emissive regions display blue, and
the plurality of third emissive regions display green.

20. The display device of claim 16, wherein
a first emissive region of the plurality of first emissive regions, a second emissive region of the plurality of second emissive regions, and a third emissive region of the plurality of third emissive regions form a dot.

* * * * *